US010856426B2

(12) United States Patent
Jeon

(10) Patent No.: US 10,856,426 B2
(45) Date of Patent: Dec. 1, 2020

(54) ROLLABLE DISPLAY DEVICE

(71) Applicant: LG DISPLAY CO., LTD., Seoul (KR)

(72) Inventor: Yongjoon Jeon, Gyeonggi-do (KR)

(73) Assignee: LG DISPLAY CO., LTD., Seoul (KR)

( * ) Notice: Subject to any disclaimer, the term of this patent is extended or adjusted under 35 U.S.C. 154(b) by 141 days.

(21) Appl. No.: 16/141,043

(22) Filed: Sep. 25, 2018

(65) Prior Publication Data

US 2019/0098776 A1    Mar. 28, 2019

(51) Int. Cl.
| | |
|---|---|
| *H05K 1/00* | (2006.01) |
| *H05K 5/00* | (2006.01) |
| *H05K 5/02* | (2006.01) |
| *H05K 5/03* | (2006.01) |
| *H01L 51/00* | (2006.01) |
| *G09F 9/30* | (2006.01) |
| *H01L 51/52* | (2006.01) |
| *G02F 1/1333* | (2006.01) |
| *H01L 27/32* | (2006.01) |

(52) U.S. Cl.
CPC .......... *H05K 5/0017* (2013.01); *G09F 9/301* (2013.01); *H01L 51/0097* (2013.01); *H05K 5/0056* (2013.01); *H05K 5/0217* (2013.01); *H05K 5/03* (2013.01); *G02F 1/133305* (2013.01); *G02F 1/133308* (2013.01); *H01L 27/3225* (2013.01); *H01L 27/3276* (2013.01); *H01L 51/5246* (2013.01); *H01L 51/5259* (2013.01); *H01L 2251/5338* (2013.01)

(58) Field of Classification Search
CPC . G06F 1/1616; G06F 1/1683; H01L 51/0096; H01L 51/5237; H01L 51/0097; H01L 2251/5338
USPC ............... 361/679.27, 679.28, 749; 359/538; 313/511; 257/89
See application file for complete search history.

(56) References Cited

U.S. PATENT DOCUMENTS

| | | | | |
|---|---|---|---|---|
| 6,038,800 | A * | 3/2000 | Seidel | G09F 11/29 40/514 |
| 2017/0091340 | A1* | 3/2017 | Yoon | G09G 3/20 |

* cited by examiner

*Primary Examiner* — Binh B Tran
(74) *Attorney, Agent, or Firm* — Polsinelli PC

(57) ABSTRACT

The present disclosure provides a rollable display device that can prevent a step between a roller and a display panel and can prevent damage to a printed circuit board and an IC etc. for driving and controlling the display panel, by forming a protrusion radially protruding on the outer side of the roller formed in a cylindrical shape for rolling the display panel and by forming a seat radially recessed on the outer side.

24 Claims, 12 Drawing Sheets

ROLLABLE DISPLAY DEVICE

CROSS REFERENCE TO RELATED APPLICATION

This application claims priority from Korean Patent Application No. 10-2017-0126530, filed on Sep. 28, 2017, which is hereby incorporated by reference in its entirety for all purposes as if fully set forth herein.

BACKGROUND

Field of the Disclosure

The present disclosure relates to a rollable display device and, more particularly, to a rollable display device that can prevent damage to a printed circuit board, an IC etc. for driving and controlling a display panel and can prevent damage or deformation of the display panel by preventing a step between the display panel and a roller due to the thickness of the display panel when the display panel is rolled.

Description of the Background

In general, as flat display devices, a liquid crystal display device, a plasma display device, a field emission display device, and a light emitting display device etc. have been actively studied, but a liquid crystal display device and a light emitting display device have been spotlighted for the advantages of mass production technology, convenience of a driving device, and implementation of a high quality.

Recently, research and development about technical defects of flat display devices and research and development of about the structures of rolling type and folding type display products that can further appeal to customers have become increasingly important. A rollable display device of the related art shown in FIG. 1 includes a display panel 110 for displaying images and a roller 120 for winding the display panel 110.

However, according to such a rollable display device, it is difficult to stow a printed circuit board for driving and controlling a display panel when the display panel is rolled, so the printed circuit board is unavoidably exposed to the outside or a specific housing is required. Accordingly, the structure becomes complicated, the volume is large, and many more parts are inevitably required.

Furthermore, a step is generated between the roller and the display panel due to the thickness of the display panel when the display panel is rolled and display panels are stacked at the step, so the display panels are deformed or damaged.

Accordingly, a study for implementing a rollable display panel without these problems is required.

SUMMARY

In this background, an aspect of the present disclosure is to provide a rollable display device that can roll and unroll a display panel without damage or deformation of a printed circuit board and an IC etc. for driving and controlling the display panel.

Another aspect of the present disclosure is to provide a rollable display device that can stably roll a display device by preventing damage or deformation of the display panel by preventing a step between the display panel and a roller due to the thickness of the display panel when the display panel is rolled.

Further, the aspect of the present disclosure is not limited thereto, and other unmentioned aspects of the present disclosure may be clearly appreciated by those skilled in the art from the following descriptions.

In accordance with an aspect of the present disclosure, there is provided a rollable display device that can prevent a step between a roller and a display panel and can prevent damage to a printed circuit board and an IC etc. for driving and controlling the display panel, by forming a protrusion radially protruding on the outer side of the roller formed in a cylindrical shape for rolling the display panel and by forming a seats radially recessed on the outer side.

As described above, according to aspects of the present disclosure, it is possible to achieve a rollable display device that can roll and unroll a display panel while preventing damage to a printed circuit board and an IC etc. for driving and controlling the display panel.

Further, according to aspects of the present disclosure, it is possible to achieve a rollable display device that can stably roll a display device by preventing damage or deformation of the display panel by preventing a step between the display panel and a roller due to the thickness of the display panel when the display panel is rolled.

BRIEF DESCRIPTION OF THE DRAWINGS

The above and other aspects, features and advantages of the present disclosure will be more apparent from the following detailed description taken in conjunction with the accompanying drawings, in which.

DETAILED DESCRIPTION

Figure 1:
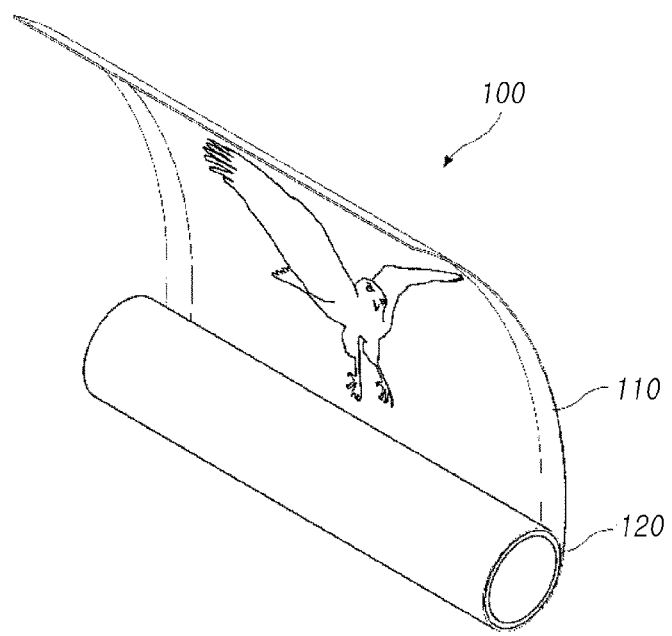
FIG. 1 is a perspective view schematically showing a rollable display device of the related art.

Hereinafter, some aspects of the present disclosure will be described in detail with reference to the accompanying illustrative drawings. In designating elements of the drawings by reference numerals, the same elements will be designated by the same reference numerals although they are shown in different drawings. Further, in the following description of the present disclosure, a detailed description of known functions and configurations incorporated herein will be omitted when it may make the subject matter of the present disclosure rather unclear.

In addition, terms, such as first, second, A, B, (a), (b) or the like may be used herein when describing components of the present disclosure. Each of these terminologies is not used to define an essence, order or sequence of a corresponding component but used merely to distinguish the corresponding component from other component(s). In the case that it is described that a certain structural element "is connected to", "is coupled to", or "is in contact with" another structural element, it should be interpreted that another structural element may "be connected to", "be coupled to", or "be in contact with" the structural elements as well as that the certain structural element is directly connected to or is in direct contact with another structural element.

Figure 2:
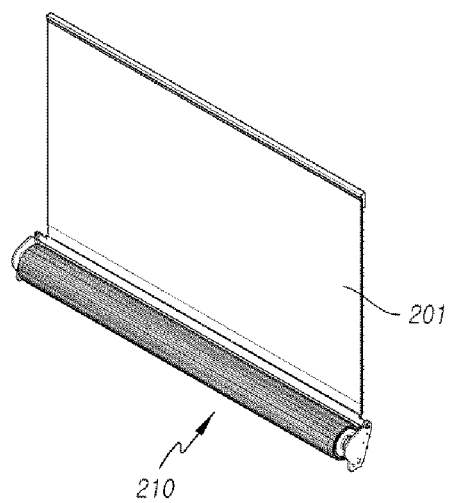
FIG. 2 is a perspective view schematically showing a rollable display device according to aspects of the present disclosure.
Figure 3:
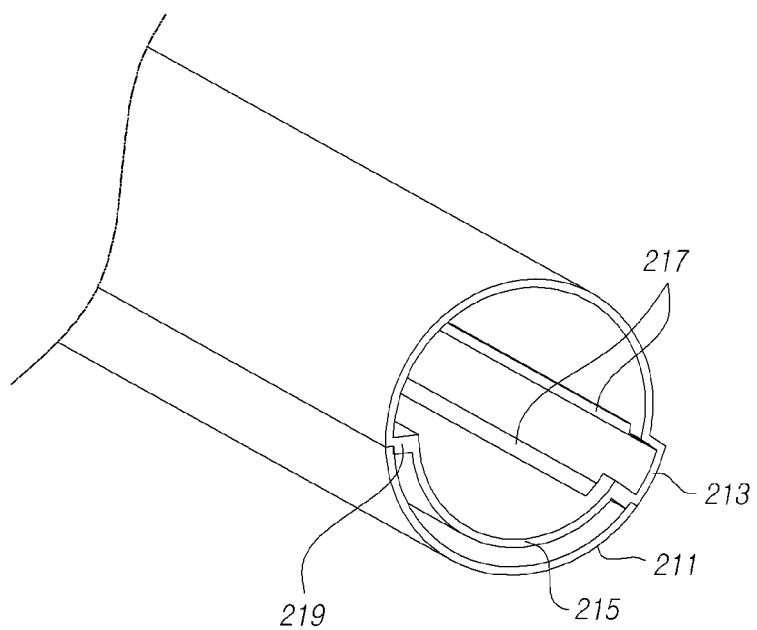
FIG. 3 is a perspective view showing some parts of the rollable display device according to aspects of the present disclosure.
Figure 4:
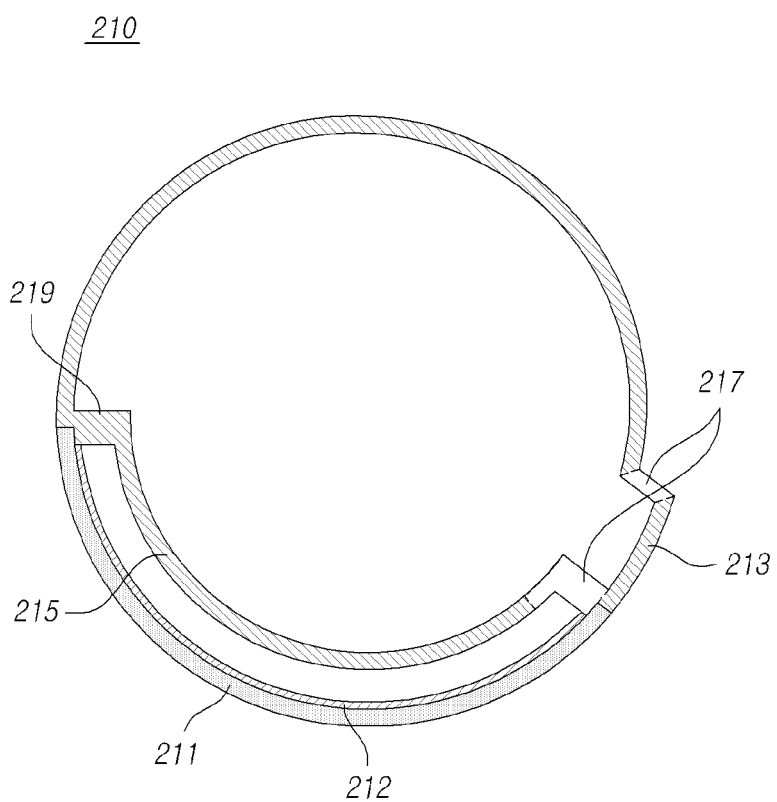
FIG. 4 is a cross-sectional view of FIG. 3.
Figure 5:
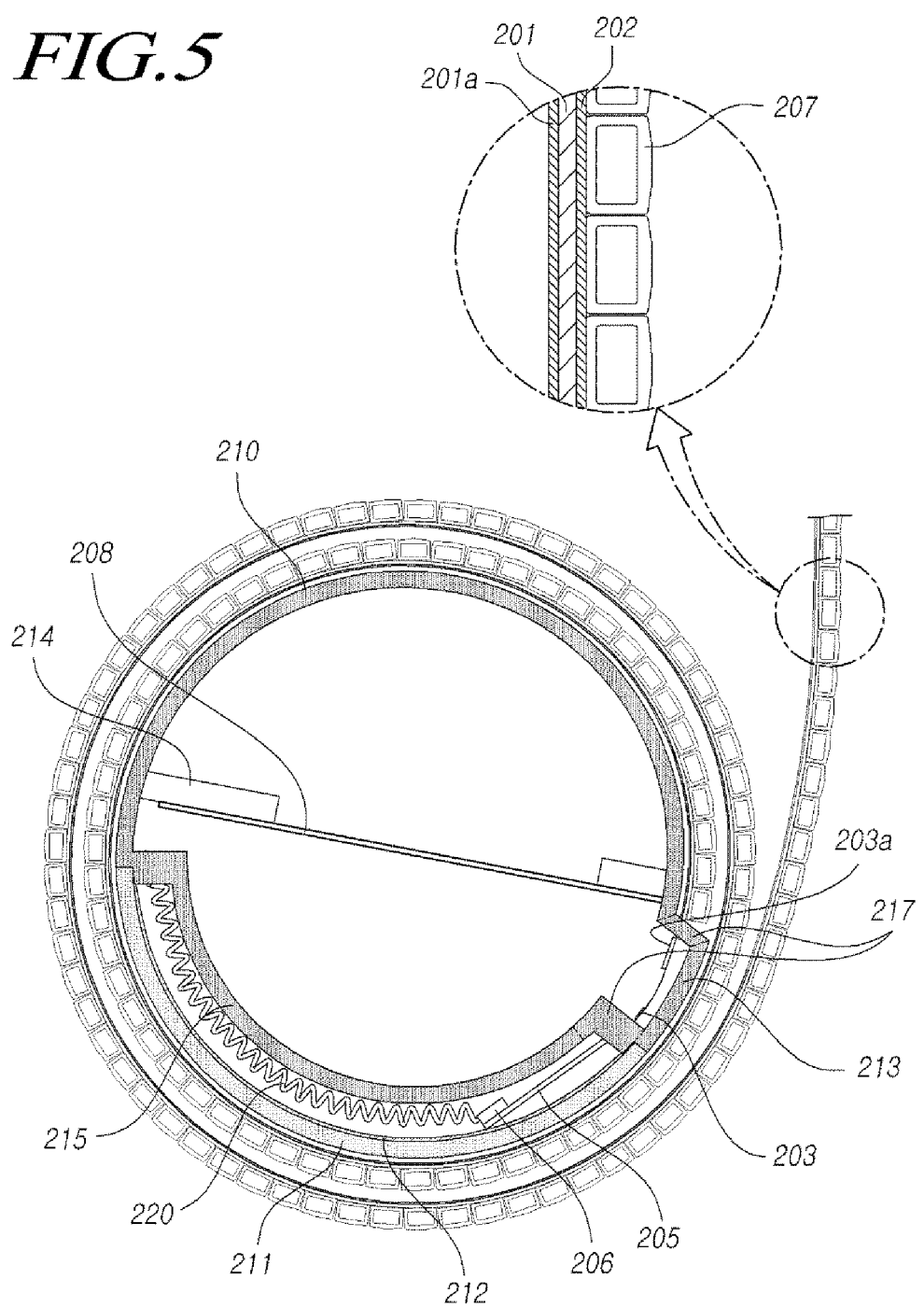
FIGS. 5 to 7 are side views showing the rollable display device according to aspects of the present disclosure.
Figure 6:
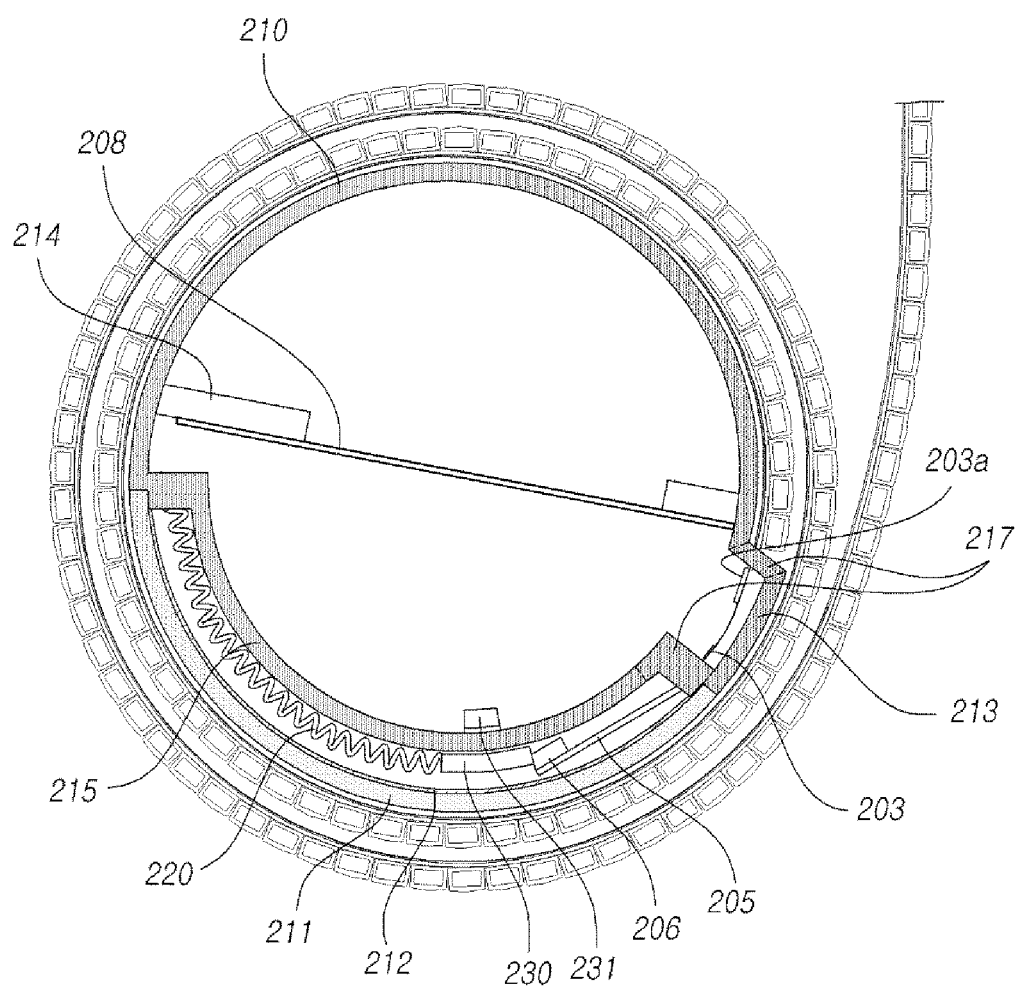
Figure 7:
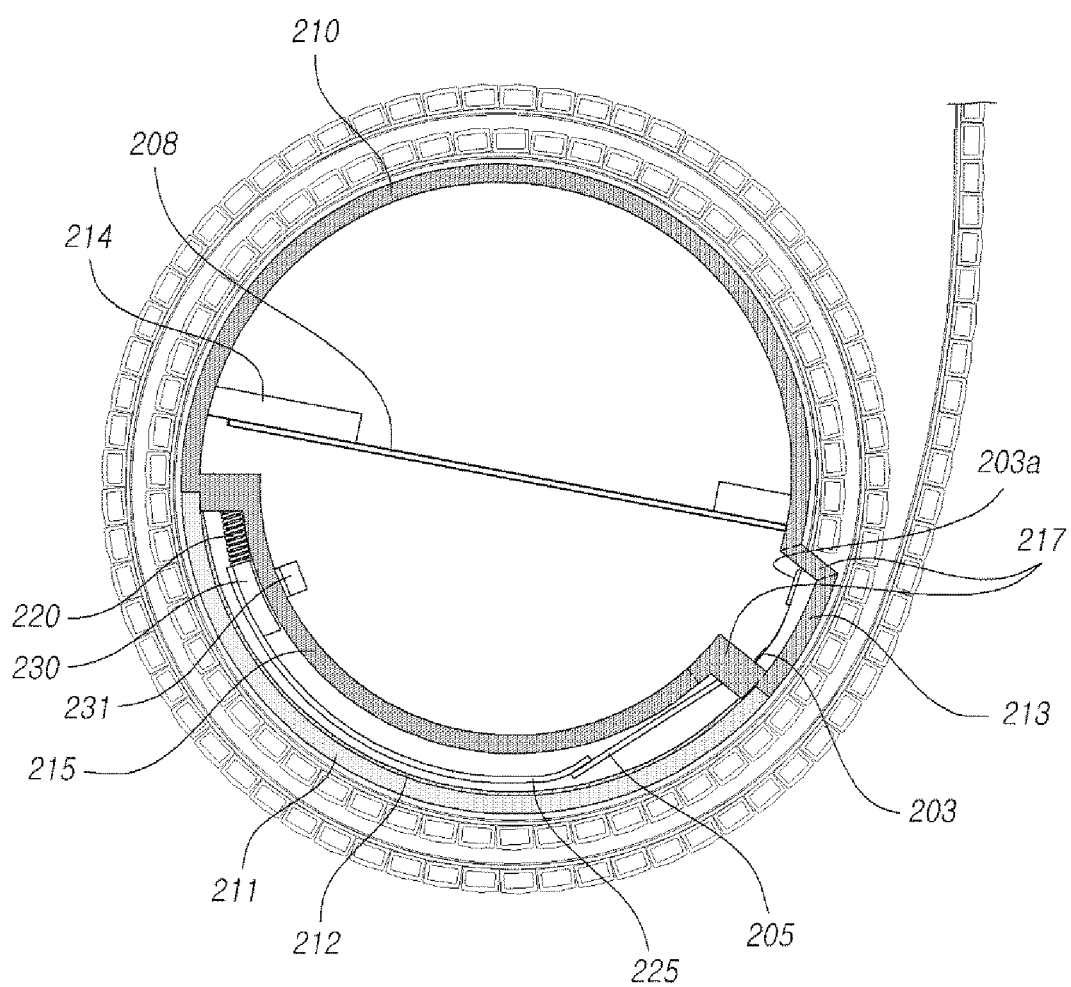
Figure 8:
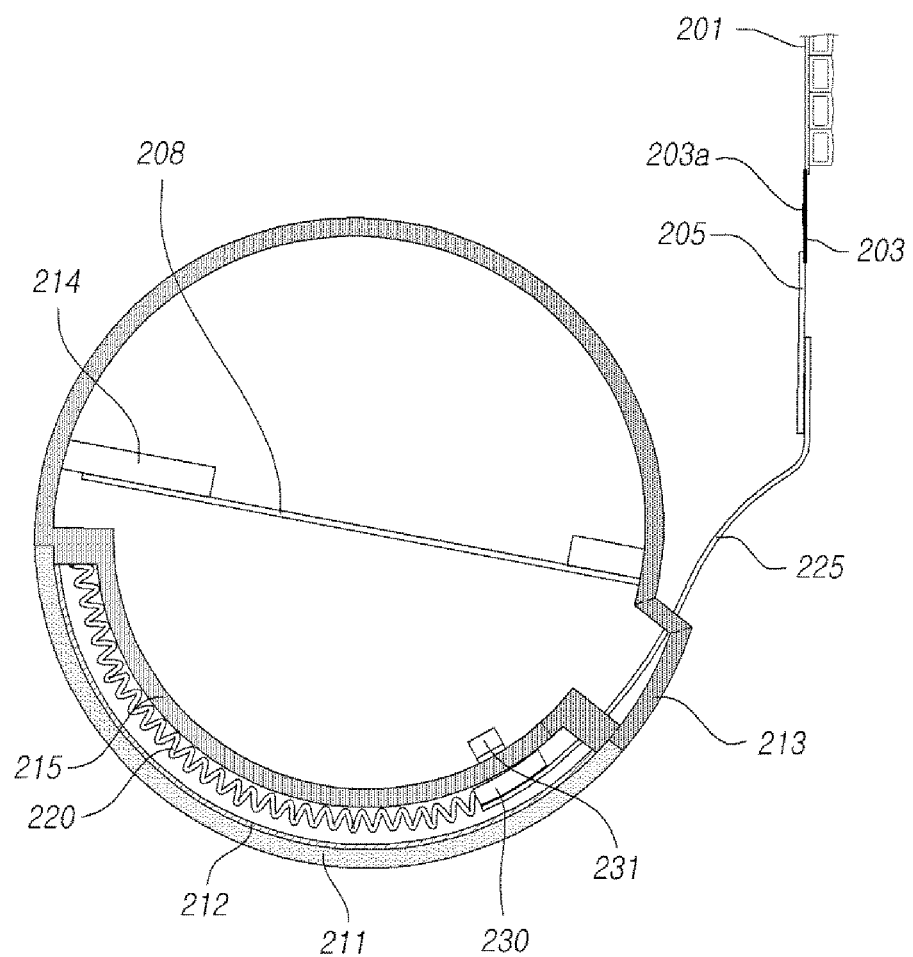
FIG. 8 is a side view when the rollable display device according to aspects of the present disclosure is fully unrolled.
Figure 9:
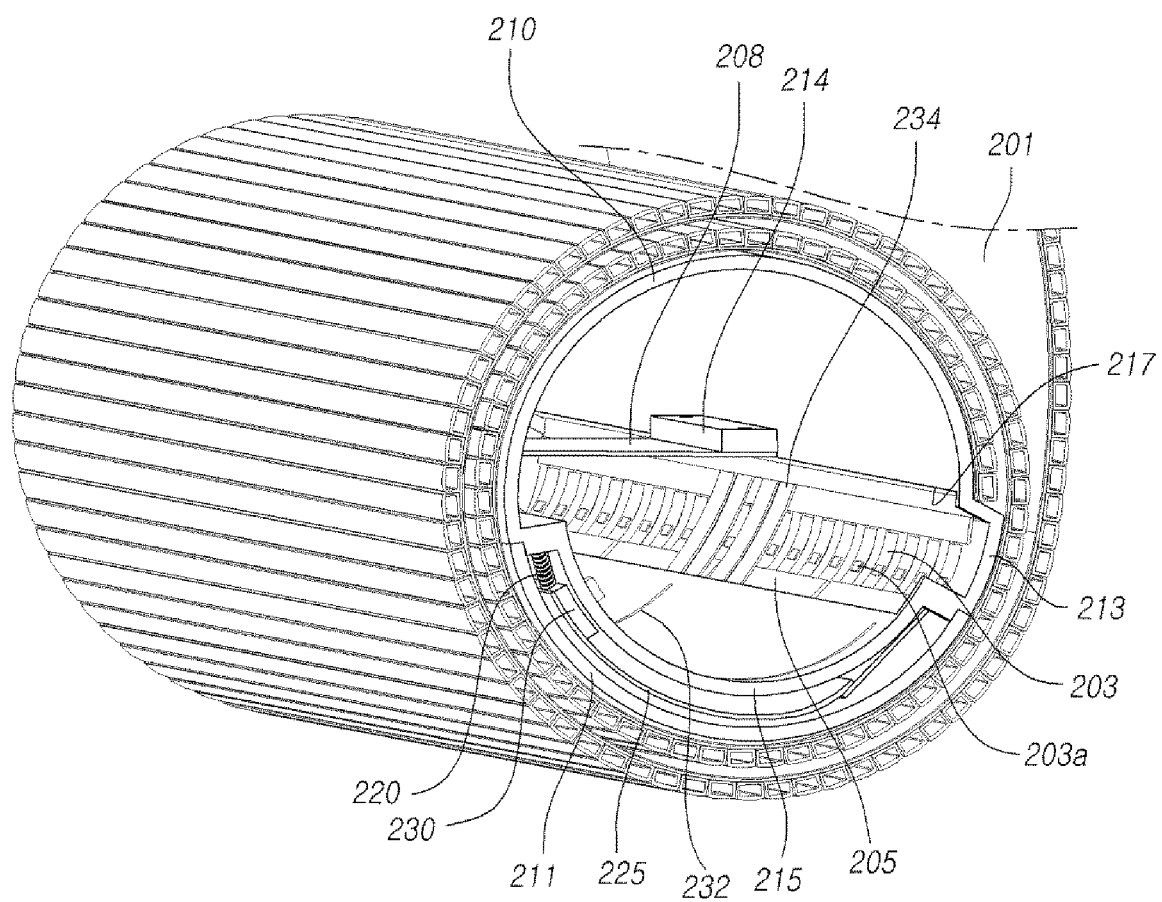
FIGS. 9 to 10 are perspective views showing the rollable display device according to aspects of the present disclosure.
Figure 10:
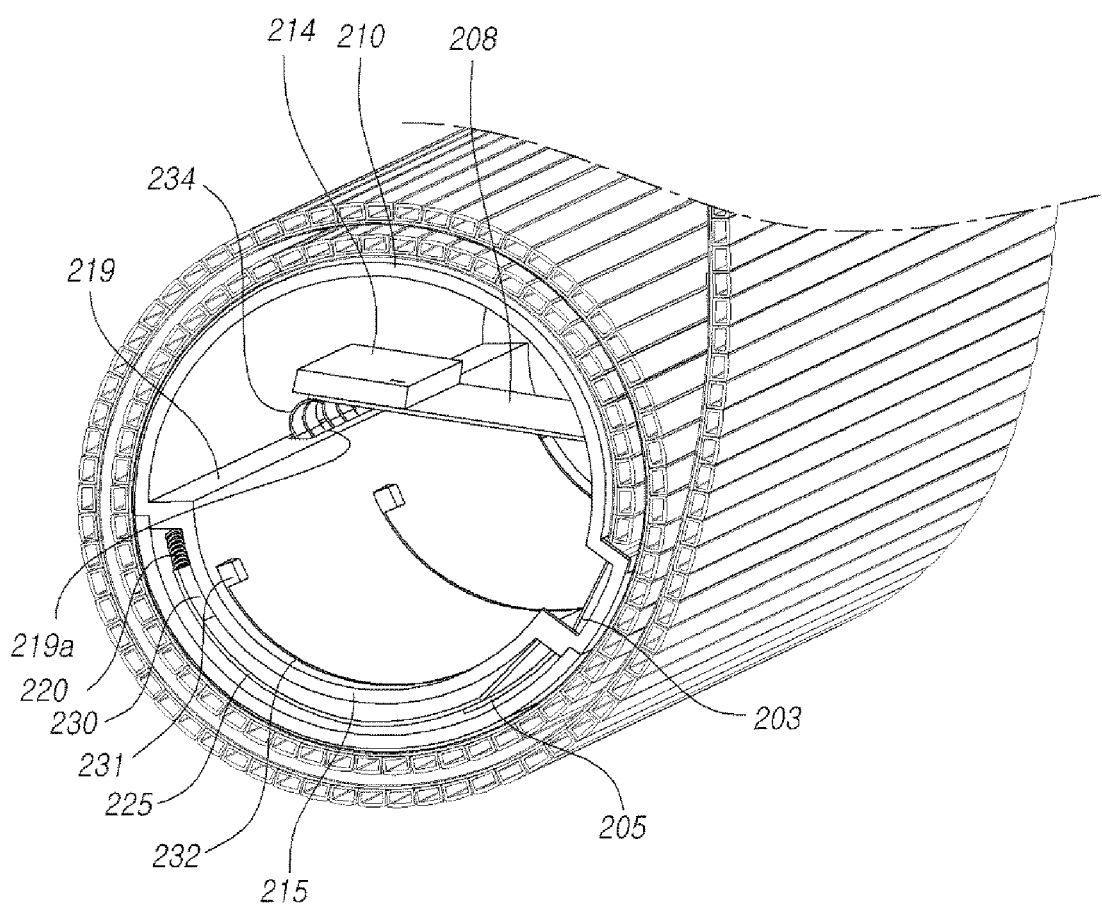
Figure 11:
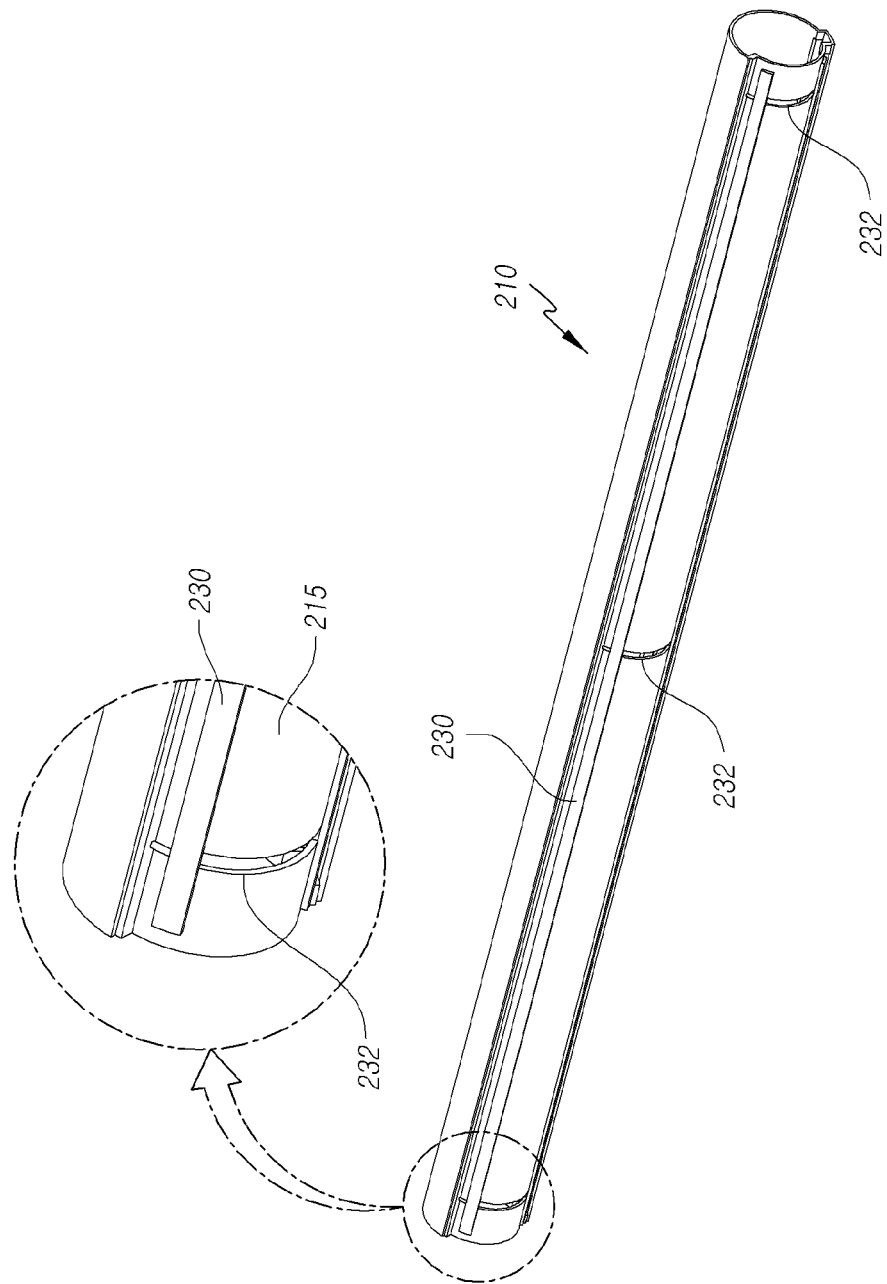
FIG. 11 is a perspective view showing parts of the rollable display device according to aspects of the present disclosure.
Figure 12:
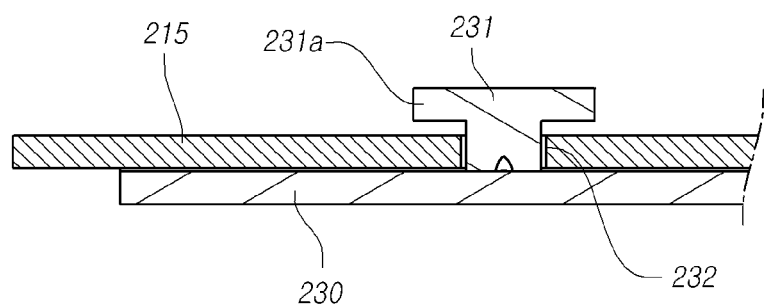
FIG. 12 is a cross-sectional view of FIG. 11.

FIG. 2 is a perspective view schematically showing a rollable display device according to aspects of the present disclosure. FIG. 3 is a perspective view showing some parts of the rollable display device according to aspects of the present disclosure. FIG. 4 is a cross-sectional view of FIG. 3. FIGS. 5 to 7 are side views showing the rollable display device according to aspects of the present disclosure. FIG. 5 is a side view when the rollable display device according to aspects of the present disclosure is fully unrolled. FIGS. 9 to 10 are perspective views showing the rollable display device according to aspects of the present disclosure. FIG. 11 is a perspective view showing some parts of the rollable display device according to aspects of the present disclosure. FIG. 12 is a cross-sectional view of FIG. 11.

As shown in the figures, a rollable display device 200 according to aspects of the present disclosure includes a display panel 201; and a roller 210 that is formed in a cylindrical shape to roll the display panel on the outer side thereof, has a protrusion 213 radially protruding from the outside thereof, and has a seat 215 radially recessed on the outer side, circumferentially connected to a side of the protrusion 213, and receiving a printed circuit board 205 connected to an end of the display panel 201 when the roller is rolled.

The rollable display device 200 according to aspects of the present disclosure prevents damage to the printed circuit boards 205 and 208 and an IC 203a etc. for driving and controlling the display panel 201 and prevents damage or deformation of the display panel 201 by preventing a step between the roller 210 and the display panel 201 due to the thickness of the display panel 201 when the display panel 201 is rolled.

The display panel 201 in aspects of the present disclosure is a flexible display panel that can implement the rollable display device 200. Furthermore, any device such as a motor or a torsion spring can be a driving unit that rotates the roller 210, so the driving unit is not described herein.

The display panel 201 for implementing a rollable display device in aspects of the present disclosure may be a liquid crystal display panel or a light emitting display panel.

When the flexible display panel 201 is a liquid crystal display panel, it may further include a backlight unit radiating light to the liquid crystal display panel, a lower polarizer attached to a lower substrate, and an upper polarizer attached to the front side of an upper substrate. The entire configuration of the lower substrate and the upper substrate can be implemented in various ways depending on the driving modes of the liquid crystal panel, for example, a Twisted Nematic (TN) mode, a Vertical Alignment (VA) mode, an In Plane Switching (IPS) mode, and a Fringe Field Switching (FFS) mode.

When the flexible display panel 201 is a light emitting display panel, the light emitting display panel may include a lower substrate having a plurality of light emitting cells in areas defined by gate lines, data lines, and power (VDD) lines, and an upper substrate attached to the lower substrate.

The light emitting cells on the lower substrate each may include at least one switching transistor connected to gate lines and data lines, at least one driving transistor connected to the switching transistor and a power line (VDD), and a light emitting device (e.g., an OLED) configured to emit light by a current that is controlled by switching of the driving transistor. Furthermore, the upper substrate may include a getter, which protects the light emitting devices from moisture or oxygen in the atmosphere, etc.

Light emitting devices connected to the driving transistors may be disposed on the upper substrate, and in this case, the light emitting devices on the lower substrate may be removed.

A light emitting display panel 201 is exemplified and there is no backlight unit because it emits light by itself in aspects of the present disclosure, and the flexible display panel 201 is exemplified in the following description.

Organic compounds in the pixel array of the light emitting display panel can be deteriorated when they are exposed to moisture or oxygen, so, in order to solve the problem of deterioration of the pixels, the pixel array can be sealed by attaching an encapsulation member to the rear side of the flexible display panel 201.

A polarizing film 201a may be bonded to the front side of the display panel 201.

Furthermore, in order to prevent light leakage by which light from the pixel array leaks out through sides, a side seal member made of a polymer containing black pigment may be disposed on the sides of the display panel 201.

On the rear side of at least any one end of the display panel 201 formed in a rectangular shape, a plurality of flexible circuit films 203 each having an IC 203a are electrically connected with the display panel 201 an the printed circuit board 205.

The flexible circuit films 203 are attached to the display panel 201 and the printed circuit board 205 by resin through Tape Automated Bonding (TAB) and may be Tape Carrier Packages (TCP) or Chip On Flexible Boards or Chip On Films (COF).

Accordingly, the display panel 201 is electrically jointed or connected to the printed circuit board 205 through the flexible circuit films 203 and the printed circuit board 205 is electrically connected to the flexible circuit films 203, thereby providing various signals for displaying images to the display panel 201.

The printed circuit board 205 for driving is electrically connected to the circuit films 203 and provides various signals for displaying images on the display panel 201, and an IC etc. for driving the display panel 201 are mounted on the printed circuit board 205. In aspects of the present disclosure, the printed circuit board 208 for control is disposed inside the roller 210 and the printed circuit board 205 is disposed on the outer side of the roller 210 to be inserted into or drawn out of the roller 220 when the display panel 201 is rolled or unrolled.

Since the roller 210 formed in a circular shape to roll the display panel 201 on the outer side thereof has the protrusion 213 radially protruding from the outer side of the cylindrical shape for rolling the display panel 201, when the display panel 201 is rolled, the display panel 201 is rolled around the outer side of the roller 210 with an end supported by the protrusion 213. Accordingly, when the display panel 201 is continuously rolled, there is no step generated between the roller 210 and the display panel 201, so damage or deformation of the display panel 201 is prevented.

A plurality of back bars 207 are attached to the rear side of the display panel 201 by an adhesive member 202, so when the display panel 201 is rolled, the back bars 207 are supported by the protrusion 213, whereby the display panel 201 can be maintained in the rolled state without being damaged.

The seat 215 radially recessed and circumferentially connected to a side of the protrusion 213 is formed on the roller 210 to accommodate the printed circuit board 205 connected to an end of the display panel 201 in rolling. Accordingly, the printed circuit board 205 can be prevented from damage due to friction and collision with the roller 210 or the display panel 201 when the display panel 201 is rolled.

The rollable display device 200 according to aspects of the present disclosure may further include a cover 211 coupled to the outer side of the roller 210 and the protrusion 213 while covering the seat 215 to form a space between the seat 215 of the roller 210 and the cover 211.

Accordingly, since a space is formed between the cover 211 and the outer side of the seat 215, when the display panel 201 is rolled and the printed circuit board 205 is inserted into the seat 215, physical damage to the printed circuit board 205 can be prevented.

Furthermore, since a first end and a second end of the cover 211 are connected to the outer side of the roller 210 and the outer side of the protrusion 213, respectively, so when the display panel 210 is rolled, the display panel 201 is circumferentially rolled along the outer side of the roller 210 and the outer side of the cover 211 with an end supported by a second end of the protrusion 213. Accordingly, there is no step formed between the roller 210 and the display panel 201, so damage or deformation of the display panel 201 can be prevented.

A damping member 212 preventing damage to the printed circuit board 205 is disposed on the inner side of the cover 211, so it is possible to prevent damage due to friction or collision between the printed circuit board 205 and the cover 211.

The roller 210 is helically formed such that the radius of curvature thereof gradually increases to prevent a step with the display panel 201. Referring to FIG. 4, the roller 210 is connected to an end of the outer side of the cover 211 such that the radius of curvature is gradually increased as it goes counterclockwise from the end connected to a side of the protrusion 213, and the second end of the outer side of the cover 211 is connected to the outer side of the protrusion 213.

Furthermore, the protrusion 213 of the roller 210 has inlet/outlet holes 217 at both sides circumferentially facing each other so that the printed circuit board 205 can be inserted into and drawn out of the seat 215. Accordingly, when the display panel 201 is rolled, the printed circuit board 205 can be received in the seat 215 through the inlet/outlet holes 217 and the printed circuit board 205 can be physically protected.

In the seat 215 of the roller 210, a first end of the elastic member 220 can be connected to a stepped inner side 219, which circumferentially faces a side of the protrusion 213, of the roller 210, that is, the inner side 219 circumferentially facing a side of the protrusion 213 along the outer side of the seat 215 and a second end of the elastic member 220 can be coupled to the printed circuit board 205 by a fixing member 206.

Accordingly, when the display panel 201 is rolled, the printed circuit board 205 can be inserted and received in the seat 215 through the inlet/outlet holes 217 by a return force of the elastic member 220 and the elastic member 220 absorbs shock in rolling, thereby being able to protect the printed circuit board 205.

Furthermore, the flexible films 234 connecting the printed circuit board 208 for controlling and the display panel 201 are also received in the seat 215 through the inlet/outlet holes 217 and connected to the printed circuit board 208 for control through a connection hole 219a formed through the inner side 219 facing a side of the protrusion 213, and the printed circuit board 208 for control is fixed by a fixing member to a supporting portion 214 formed on the inner side of the roller 210.

Furthermore, as shown in FIG. 6, in the seat 215 of the roller 210, the first end of the elastic member 220 can be coupled to the inner side circumferentially facing a side of the protrusion 213 and the second end of the elastic member 220 can be coupled to a sliding bar 230 that slides on the outer side of the seat 215 by a fixing member 206.

In this configuration, the sliding bar 230 is coupled to the printed circuit board 205 and slides on the outer side of the seat 215 by the elasticity of the elastic member 220 so that the printed circuit board 205 is inserted into and drawn out of the seat 215. Accordingly, the printed circuit board 205 can be inserted and drawn out of the seat 215 more stably without stopping by frictional supporting force on the outer side of the seat 215.

That is, if the printed circuit board 205 is directly coupled to the elastic member 220 without the sliding bar 230, the printed circuit board 205 is inserted into and drawn out directly without the return force of the elastic member 220, so an impact load may be applied to the printed circuit board 205 when it is fully inserted. However, the sliding bar 230 maintains friction on the outer side of the seat 215 while sliding, so the inserting and drawing-out speed is controlled, thereby preventing possible damage due to impact Meanwhile, as shown in FIG. 7, in the seat 215 of the roller 210, the first end of the elastic member 220 can be coupled to the side circumferentially facing a side of the protrusion 213 and the second end of the elastic member 220 can be coupled to the sliding bar 230 that slides on the outer side of the seat 215 by a fixing member 230. The sliding bar 230 can be coupled to the printed circuit board 205 through a connector 225.

In this configuration, the display panel 201 can be further drawn out by a length equal to the length of the connector 225. Further, when the display panel 201 is fully drawn out, the printed circuit board 205 is positioned outside the roller 210, so it can be prevented from being damaged due to friction and collision with the protrusion 213 of the roller 210.

Furthermore, in rolling, the sliding bar 230 maintains frictional supporting force on the outer side of the seat 215 while sliding and the connector 225 that is a flexible sheet provides predetermined elasticity between the sliding bar 230 and the printed circuit board 205. Accordingly, the sliding bar 230 can be smoothly stopped at the protrusion 213 when the printed circuit board 205 is fully drawn out.

The sliding bar 230 is elongated in the axial direction of the roller 210, so it can exactly slide on the outer side of the seat 215 of the roller 210 without biasing.

Furthermore, guide protrusions 231 may be formed on the inner side of the sliding bar 230 and guide rails 232 in which the guide protrusions 231 of the sliding bar 230 slide may be circumferentially formed in the seat 215. Accordingly, since the guide protrusions 231 of the sliding bar 230 slide in the guide rail 232, they can more stably and exactly slide.

The guide rails 232 may be circumferentially formed and spaced apart from each other with regular intervals in the seat 215. A head 231a supported by the inner side of the seat 215 and prevented from separating from the guide rail 232 is formed at the end of each of the guide protrusions 231, thereby being able to prevent the guide protrusions 231 from separating from the guide rails 232 and biasing to any one side in rolling and unrolling.

The guide protrusions 231 and the guide rails 232, as shown in FIG. 11, may be formed at least at both end portions of the roller 210, and are formed at least at both end portions and the center of the roller 210 to make uniform sliding in the circumferential direction of the seat 215 of the roller 210.

Although the aspects shown in the figures of the present disclosure were limited to a light emitting display panel, they can be applied to a liquid crystal display panel, in which a backlight module providing light to the liquid crystal display panel includes a light source module, a polarizer providing appropriate light to the liquid crystal panel by processing the light reflected by the light source module, a light adjuster, and a light reflector. The light source module is a part that converts electrical energy into light energy and it is apparent to those skilled in the art that the light source module may be a Light Emitting Diode (LED) assembly, a Cold Cathode Fluorescent Lamp (CCFL), or a Hot Cathode Fluorescent Lamp (HCFL), so it is not described in detail herein.

As described above, according to aspects of the present disclosure, it is possible to achieve a rollable display device that can roll and unroll a display panel while preventing damage to a printed circuit board 205 and an IC etc. for driving and controlling the display panel.

Further, according to aspects of the present disclosure, it is possible to achieve a rollable display device that can stably roll a display device by preventing damage or deformation of the display panel by preventing a step between the display panel and a roller due to the thickness of the display panel when the display panel is rolled.

Even if it was described above that all of the components of an aspect of the present disclosure are coupled as a single unit or coupled to be operated as a single unit, the present disclosure is not necessarily limited to such an aspect. That is, at least two elements of all structural elements may be selectively joined and operate without departing from the scope of the present disclosure.

In addition, since terms, such as "including," "comprising," and "having" mean that one or more corresponding components may exist unless they are specifically described to the contrary, it shall be construed that one or more other components can be included. All the terms that are technical, scientific or otherwise agree with the meanings as understood by a person skilled in the art unless defined to the contrary. Common terms as found in dictionaries should be interpreted in the context of the related technical writings not too ideally or impractically unless the present disclosure expressly defines them so.

Although an aspect of the present disclosure has been described for illustrative purposes, those skilled in the art will appreciate that various modifications, additions and substitutions are possible, without departing from the scope and spirit of the disclosure as disclosed in the accompanying claims. Therefore, the aspects disclosed in the present disclosure are intended to illustrate the scope of the technical idea of the present disclosure, and the scope of the present disclosure is not limited by the aspect. The scope of the present disclosure shall be construed on the basis of the accompanying claims in such a manner that all of the technical ideas included within the scope equivalent to the claims belong to the present disclosure.

What is claimed is:

1. A rollable display device comprising:
   a display panel;
   a roller formed in a cylindrical shape to roll the display panel, having a protrusion radially protruding from an outside, and having a seat radially recessed on an outer side, circumferentially connected to a side of the protrusion, and receiving a printed circuit board connected to an end of the display panel when the roller is rolled, and
   a cover coupled to the outer side of the roller and the protrusion and covering the seat to form a space between the seat and the cover;
   a damping member preventing damage to the printed circuit board and disposed on an inner side of the cover.

2. The rollable display device of claim 1, wherein the protrusion of the roller has inlet/outlet holes at both sides circumferentially facing each other so that the printed circuit board is inserted into and drawn out of the seat.

3. The rollable display device of claim 2, wherein the seat of the roller has a first end of an elastic member connected to an inner side circumferentially facing a side of the protrusion and a second end of the elastic member is coupled to the printed circuit board.

4. The rollable display device of claim 2, wherein the seat of the roller has a first end of an elastic member connected to an inner side circumferentially facing a side of the protrusion, a second end of the elastic member is coupled to a sliding bar sliding on the outer side of the seat, and the sliding bar is coupled to the printed circuit board.

5. The rollable display device of claim 2, wherein the seat of the roller has a first end of an elastic member is connected to an inner side circumferentially facing the side of the protrusion, a second end of the elastic member is coupled to a sliding bar sliding on the outer side of the seat, and the sliding bar is coupled to the printed circuit board through a fixing member.

6. The rollable display device of claim 4, wherein the sliding bar is elongated in an axial direction of the roller.

7. The rollable display device of claim 6, further comprising guide protrusions are formed on an inner side of the sliding bar and guide rails in which the guide protrusions of the sliding bar slide are circumferentially formed in the seat.

8. The rollable display device of claim 7, further comprising a head supported by the inner side of the seat and preventing from separating from the guide rails formed at the end of each of the guide protrusion.

9. The rollable display device of claim 7, wherein the guide protrusions and the guide rails are formed at least at both end portions of the roller.

10. The rollable display device of claim 7, wherein the guide protrusions and the guide rails are formed at least at both end portions and a center of the roller.

11. The rollable display device of claim 1, further comprising a plurality of back bars attached to a rear side of the display panel.

12. The rollable display device of claim 11, wherein an end of the display panel and the back bars are supported by the protrusion when the roller is rolled.

13. A rollable display device comprising:
   a rollable display panel;
   a roller having a cylindrical shape on which the rollable display panel is rolled or unrolled on an outer side of the roller, wherein the roller has a protrusion radially protruding from an outside and a seat radially recessed on an outer side of the roller and circumferentially connected to a side of the protrusion;

a printed circuit board controlling the rollable display panel, disposed inside the roller and inserted into or drawn out of the roller when the display panel is rolled or unrolled;

a cover coupled to the outer side of the roller and the protrusion and covering the seat to form a space between the seat and the cover; and a damping member preventing damage to the printed circuit board and disposed on an inner side of the cover, wherein the seat receives the printed circuit board connected to an end of the display panel when the roller is rolled.

14. The rollable display device of claim 13, wherein the protrusion of the roller has inlet/outlet holes at both sides circumferentially facing each other so that the printed circuit board is inserted into and drawn out of the seat.

15. The rollable display device of claim 14, wherein the seat of the roller has a first end of an elastic member connected to an inner side circumferentially facing a side of the protrusion and a second end of the elastic member is coupled to the printed circuit board.

16. The rollable display device of claim 14, wherein the seat of the roller has a first end of an elastic member connected to an inner side circumferentially facing a side of the protrusion, a second end of the elastic member is coupled to a sliding bar sliding on the outer side of the seat, and the sliding bar is coupled to the printed circuit board.

17. The rollable display device of claim 14, wherein the seat of the roller has a first end of an elastic member is connected to an inner side circumferentially facing the side of the protrusion, a second end of the elastic member is coupled to a sliding bar sliding on the outer side of the seat, and the sliding bar is coupled to the printed circuit board through a fixing member.

18. The rollable display device of claim 17, wherein the sliding bar is elongated in an axial direction of the roller.

19. The rollable display device of claim 18, further comprising guide protrusions are formed on an inner side of the sliding bar and guide rails in which the guide protrusions of the sliding bar slide are circumferentially formed in the seat.

20. The rollable display device of claim 19, further comprising a head supported by the inner side of the seat and preventing from separating from the guide rails formed at the end of each of the guide protrusion.

21. The rollable display device of claim 19, wherein the guide protrusions and the guide rails are formed at least at both end portions of the roller.

22. The rollable display device of claim 19, wherein the guide protrusions and the guide rails are formed at least at both end portions and a center of the roller.

23. The rollable display device of claim 13, further comprising a plurality of back bars attached to a rear side of the rollable display panel.

24. The rollable display device of claim 23, wherein an end of the rollable display panel and the back bars are supported by the protrusion when the roller is rolled.

* * * * *